(12) United States Patent
Lee et al.

(10) Patent No.: US 6,650,148 B1
(45) Date of Patent: Nov. 18, 2003

(54) SENSE AMPLIFIER CIRCUIT

(75) Inventors: Yu-Wei Lee, Taichung (TW); Sheau-Yung Shyu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,373

(22) Filed: Jul. 8, 2002

(51) Int. Cl.[7] .......................... G01R 19/00; G11C 7/00; H03F 3/45
(52) U.S. Cl. .............................................. 327/51; 327/57
(58) Field of Search ............................... 327/51, 52–57; 365/203, 207, 189.05

(56) References Cited

U.S. PATENT DOCUMENTS

| | | | | |
|---|---|---|---|---|
| 5,619,149 A | * | 4/1997 | Lev et al. ...................... | 327/51 |
| 5,771,196 A | * | 6/1998 | Yang .......................... | 365/207 |
| 6,297,670 B1 | * | 10/2001 | Chao et al. .................... | 327/51 |
| 6,301,179 B1 | * | 10/2001 | Lawson ....................... | 365/207 |
| 6,411,550 B1 | * | 6/2002 | Nasu ....................... | 365/185.21 |

\* cited by examiner

*Primary Examiner*—Tuan T. Lam
(74) *Attorney, Agent, or Firm*—Jiang Chyun IP Office

(57) ABSTRACT

A sense amplifier circuit for sensing data fed to its data input terminal and operating on the data according to a pre-charge signal, a latch signal and a sense amplifier enable signal. The sense amplifier circuit includes a pre-charge sense circuit that receives data from a data input terminal and outputs a first output value as well as a latching circuit that receives the first output value and outputs a second output value within a preset period. The pre-charge sense circuit further includes a first circuit and a second circuit. The first circuit is capable of pre-charging the data input terminal to a preset potential level. The second circuit produces a first output value according to the input data. In addition, the first circuit and the second circuit are connected in parallel between a voltage source and a data input terminal.

4 Claims, 4 Drawing Sheets

SENSE AMPLIFIER CIRCUIT

BACKGROUND OF THE INVENTION

1. Field of Invention

The present invention relates to a sense amplifier circuit. More particularly, the present invention relates to a sense amplifier circuit that uses different routes to carry out pre-charging and sensing.

2. Description of Related Art

In general, sense amplifiers can be divided into two sections, a pre-sense circuit and a latch circuit. FIG. 1A is a circuit diagram of a conventional pre-sense circuit and FIG. 1B is a circuit diagram of a conventional latch circuit. To describe the operation of the sense amplifier circuit, a timing diagram of the signals used by the sense amplifier is shown in FIG. 3. In the pre-charge period, the signal PCB (the pre-charge signal) is pulled down and the output voltage VZ is pulled up via the transistor M4. In the meantime, because the signal SAB (sense amplifier enable signal) is pulled down, voltage at the data input terminal DL is pulled up to a high potential due to the simultaneous action of the transistors M2 and M5.

As the sense amplifier moves from the pre-charge period into the data-sensing period, the transistor M4 is shut down as voltage of the PCB signal is pulled up. At this moment, data is input into the pre-charge circuit 10 through the data line DL. If the data is a "0" (a high potential), the output voltage VZ is maintained at the original high voltage state. On the other hand, if the data is a "1", (a low potential), current is dissipated via the transistor M5 and potential of the output voltage VZ is pulled down.

Finally, as the sense amplifier moves into the data-latching period, potential of the LATB signal (latch signal) is pulled up. Hence, the output voltage VZ provided by the pre-sense circuit 10 is applied to the latch circuit 14. The latching portion (consisting of inverters M10 and M11) of the latching circuit 14 latches the resultant signal from the phase-reversing portion (consisting of transistors M6–M9) of the latching circuit 14. After ascertaining the validity of the data, a SAB signal and a voltage source for driving subsequent circuit are output from the latching circuit 14.

In brief, to increase the sensing speed of the sense amplifier, time for pulling the voltage VZ from a high potential to a low potential must be shortened. A faster pull-down time may be achieved by (i) increasing the voltage gain of the NOR logic gate 102, (ii) lowering the parasitic loading of the output voltage VZ, or (iii) adding a diode between the transistor M4 and the power source voltage VDD. However, method (i) may lead to over-sensitivity of the sense amplifier to noise. For method (ii), because the output voltage VZ must have a definite degree of parasitic loading to prevent noise coupling, ultimate reduction in parasitic loading is limited. Although method (iii) is capable of reducing the degree of fluctuation of the output voltage VZ, the pre-charging operation is carried out at different voltages and temperatures, leading to unpredictable instability. Such instability may lead to insufficient or excessive pre-charging at the data input terminal DL, thereby affecting ultimate sensing accuracy.

SUMMARY OF INVENTION

Accordingly, one object of the present invention is to provide a sense amplifier circuit capable of increasing data-sensing speed with no accompanying drawbacks.

To achieve these and other advantages and in accordance with the purpose of the invention, as embodied and broadly described herein, the invention provides a sense amplifier circuit. Data is fed to a data input terminal of the sense amplifier and the sense amplifier operates according to a pre-charge signal, a latch signal and a sense amplifier enable signal. The sense amplifier circuit includes a pre-charge sense circuit capable of receiving data from a data input terminal and outputting a first output value. The sense amplifier circuit also includes a latching circuit capable of receiving the first output value and outputting a second output value after a preset period. The pre-charge sense circuit further includes a first circuit and a second circuit. The first circuit is capable of pre-charging the data input terminal to a preset potential level. The second circuit is capable of generating the first output value based on input data fed to the data input terminal. In addition, the first circuit and the second circuit are connected in parallel between a voltage source and a data input terminal.

This invention also provides a sense amplifier circuit for sensing data fed to its data input terminal and operates according to pre-charge signals, latching signals and sense amplifier enable signals. The sense circuit includes a plurality of transistors and a latching circuit. The first conductive terminal of a first transistor is electrically coupled to a voltage source and the gate terminal of the first transistor is electrically coupled to a pre-charge signal terminal. The second conductive terminal of a second transistor is electrically coupled to the data input terminal. A logic gate operation between the data input terminal signal and the sense amplifier enable signal is carried out by a NOR logic gate. Output from the NOR logic gate is fed to the gate terminal of the second transistor. The first conductive terminal of the second transistor and the second conductive terminal of the first transistor are electrically connected together. The first conductive terminal of a third transistor is electrically coupled to the voltage source and the second conductive terminal of the third transistor is electrically coupled to the gate terminal of the third transistor. The first conductive terminal of a fourth transistor is electrically coupled to the second conductive terminal of the third transistor and the gate terminal of the fourth transistor is electrically coupled to the pre-charge signal terminal. The first conductive terminal of a fifth transistor is electrically coupled to the second conductive terminal of the fourth transistor and the second conductive terminal of the fifth transistor is electrically coupled to the data input terminal. The result of the aforementioned logic computation is fed to the gate terminal of the fifth transistor. The latching circuit includes an input terminal and an output terminal. The input terminal of the latching circuit is electrically coupled to the second conductive terminal of the fourth transistor for receiving an output value. In addition, according to the latching signal, the output terminal of the latching circuit outputs an output value that corresponds to the received output value from the input terminal within a preset period.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
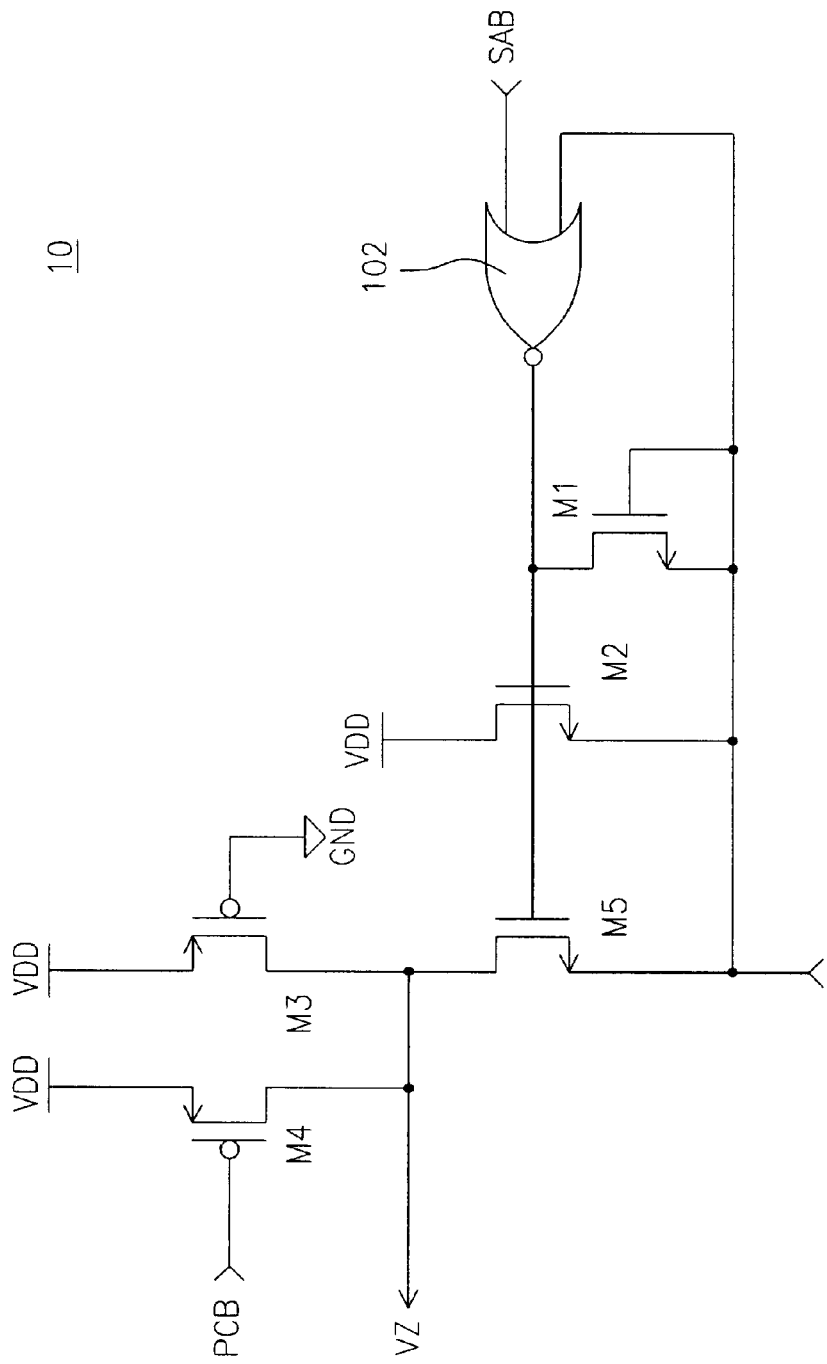
FIG. 1A is a circuit diagram of a conventional pre-sense circuit.
Figure 1B:
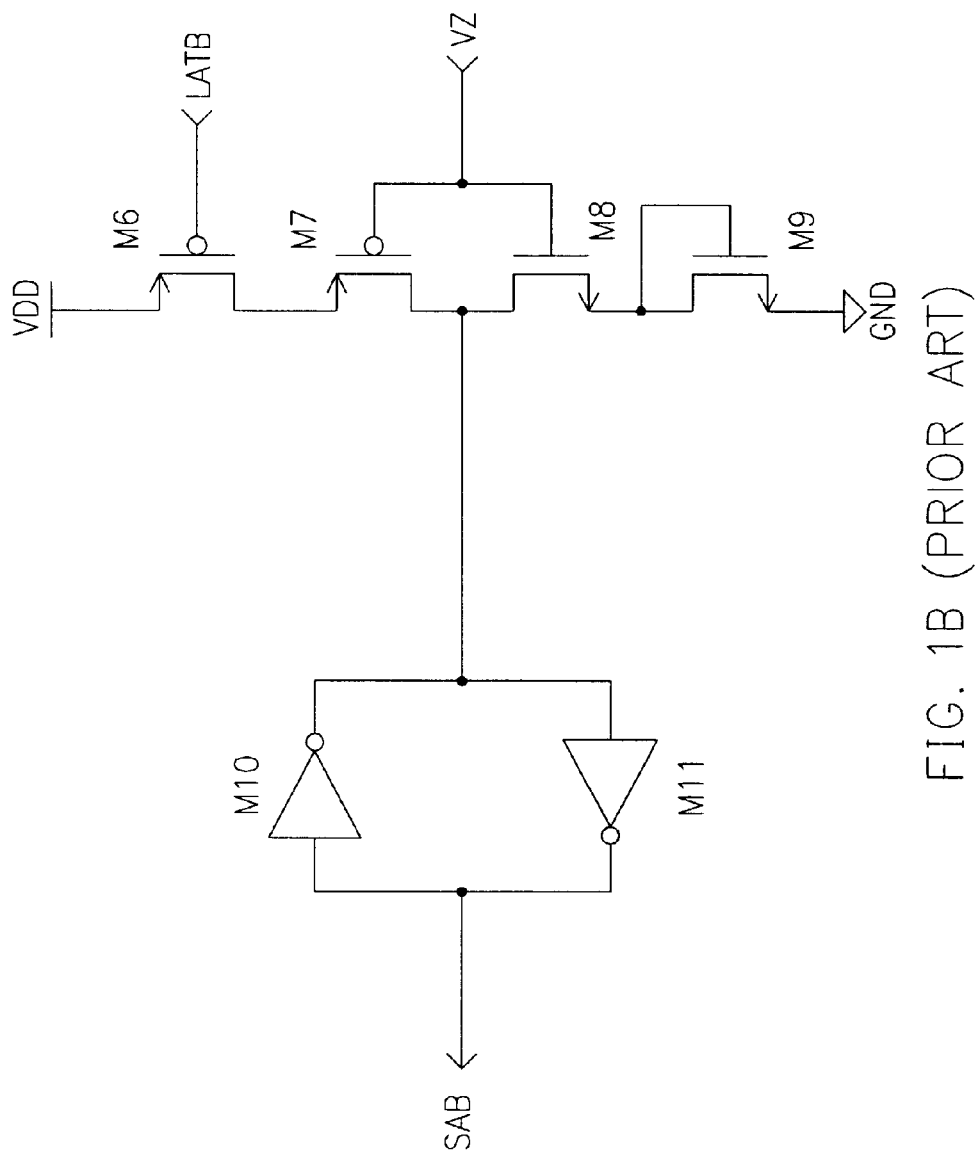
FIG. 1B is a circuit diagram of a conventional latch circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
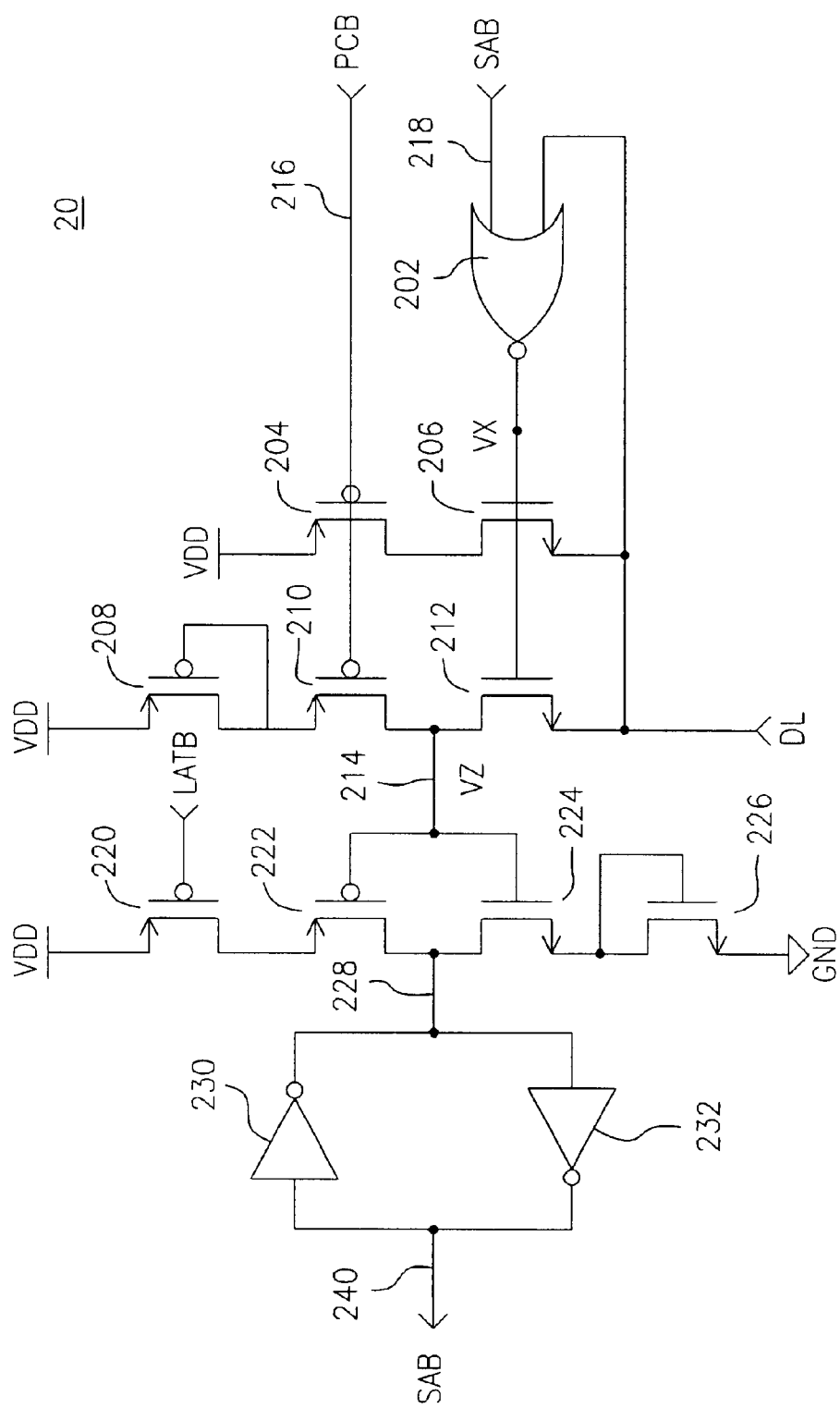
FIG. 2 is a circuit diagram of a sense amplifier according to one preferred embodiment of this invention.
Figure 3:
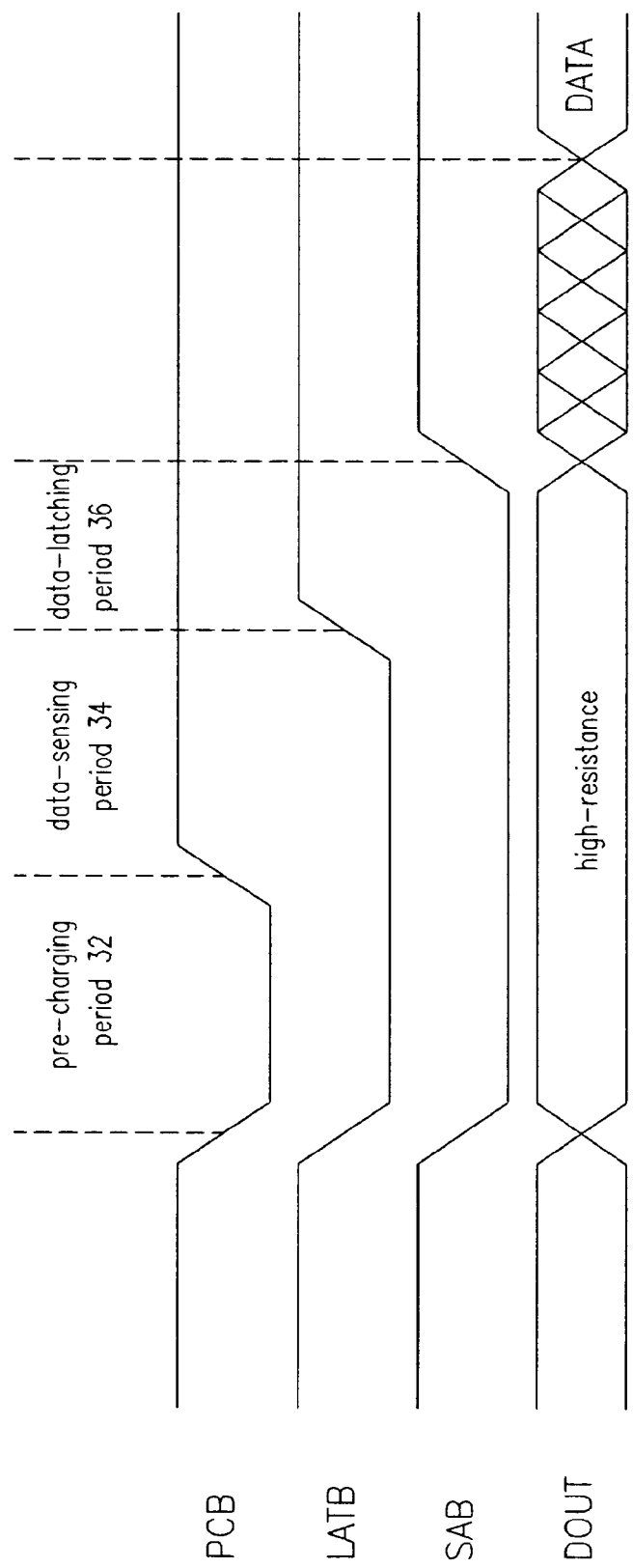
FIG. 3 is a timing diagram of the signals produced by a sense amplifier circuit.

FIG. 2 is a circuit diagram of a sense amplifier according to one preferred embodiment of this invention. FIG. 3 is a timing diagram of the signals produced by a sense amplifier circuit. As shown in FIG. 2, the sense amplifier circuit 20 comprises a NOR logic gate 202 and a group of transistors 204 to 212. According to data fed to the data input terminal DL, an output voltage VZ is generated on a signal transmission wire 214. The circuit that includes the transistors 220 to 226 and a pair of inverters 230 and 232 receives the output voltage VZ via the signal transmission wire 214. Ultimately, an output value is produced by the circuit on an output signal wire 240 according to the output voltage VZ within a preset period.

Referring to FIG. 2 and FIG. 3, following is a detailed description of the operation of the sense amplifier circuit 20. To begin operation, the sense amplifier circuit 20 has to establish a stable and fixed pre-charge signal (PCB), sense amplifier enable signal (SAB) and a latching signal (LATB). Thereafter, in the pre-charging period 32, the circuit consisting of the transistor 204 and 206 pulls the potential of the data input terminal DL to a high level. A conductive terminal of the transistor 204 is electrically coupled to a voltage source VDD while another conductive terminal of the transistor 204 is electrically coupled a conductive terminal of the transistor 206. Another conductive terminal of the transistor 206 is electrically coupled to the data input terminal DL. Meanwhile, the PCB signal is applied to the gate terminal of the transistor 204 via a signal transmission wire 216 and the SAB signal is transmitted into the sense amplifier circuit 20 via a signal transmission wire 218. The PCB signal and the SAB signal are logically operated by the NOR gate 202 to produce an output. The output from the NOR gate 202 is fed to the gate terminal of the transistor 206. In the pre-charging period 32, voltage at the data input terminal is pulled up to a fixed level through the opening of the transistors 204 and 206 triggered by the downward pulling of the PCB signal and the SAB signal. Similarly, the transistors 208, 210 and 212 are opened so that not only is charging of the data input terminal DL initiated but voltage at the signal transmission wire 214 is also pulled up.

Within the data-sensing period 34, potential of the PCB signal is pulled up and necessary sense data is input to the data input terminal. Hence, both the transistor 204 and the transistor 210 are shut. The opening or shutting of the transistors 206 and 212 depends on the potential level at the data input terminal DL. When the sense data to be detected has a high potential (a high potential is represented by "0"), the transistors 206 and 212 are both shut. Hence, voltage on the signal transmission wire 214 remains unchanged and the output voltage VZ remains at a high potential. On the other hand, when the sense data to be detected has a low potential (a low potential is represented by "1"), the transistors 206 and 212 are both opened. Hence, any charges are dissipated by a current flowing from the signal transmission wire 214, which has a relatively high potential, to the data line DL via the transistor 212. Ultimately, potential at the signal transmission wire 214 falls, resulting in a low output voltage VZ.

In the data-latching period 36, potential of the LATB signal is pulled up so that the output voltage VZ applied to the gate terminal of the transistors 222 and 224 can serve as a gate control voltage. Due to the variation of the output voltage VZ, the transistors 222 and 224 will open or close accordingly. According to the opening or closing state of the transistors 222 and 224, potential at the signal transmission wire 228 is changed. Potential at the signal transmission wire 228 is latched by the circuit consisting of the pair of inverters 230 and 232. After a period of latching so that possible errors are eliminated, the signal is output via the signal transmission wire 240 as a SAB signal for driving subsequent circuit.

By providing a diode (in here, a PMOS transistor is used, but by no means limits the design to a PMOS transistor) between the transistor 210 and the voltage source VDD, voltage fluctuation of output voltage VZ is minimized. Furthermore, without interfering with the pre-charging structure (transistors 204 and 206), time required to detect sense data is shortened. In addition, dimensions of the transistor 212 can be increased so that data-sensing speed is increased without any deterioration of safety range. Moreover, by modifying the dimensions of the transistors 204 and 206, precharging speed at the data input terminal DL can be more accurately controlled so that data-sensing speed is little affected.

In conclusion, one major aspect of this invention is the separate adjustment of data-sensing speed and pre-charging speed. Ultimately, an optimal design that balances out pre-charging requirements and data-sensing speed can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sense amplifier circuit for sensing data fed to a data input terminal thereof and operating on the data according to a pre-charge signal, a latching signal and a sense enable signal, the sense amplifier circuit comprising:

a first transistor having a first conductive terminal, a second conductive terminal and a gate terminal, wherein the first conductive terminal is electrically coupled to a voltage source and the gate terminal is electrically connected to a pre-charge signal terminal;

a second transistor having a first conductive terminal, a second conductive terminal and a gate terminal, wherein the second conductive terminal of the second transistor is electrically coupled to the data input terminal, with a signal from the data input terminal and the sense enable signal being processed in a NOR logic operation producing an output to apply to the gate terminal of the second transistor, and the first conductive terminal of the second transistor is electrically coupled to the second conductive terminal of the first transistor;

a third transistor having a first conductive terminal, a second conductive terminal and a gate terminal, wherein the first conductive terminal of the third transistor is electrically coupled to the voltage source, and the second conductive terminal of the third transistor is electrically connected to the gate terminal of the third transistor;

a fourth transistor having a first conductive terminal, a second conductive terminal and a gate terminal, wherein the first conductive terminal of the fourth transistor is electrically connected to the second conductive terminal of the third transistor, and the gate terminal of the fourth transistor is electrically coupled to the pre-charge signal terminal;

a fifth transistor having a first conductive terminal, a second conductive terminal and a gate terminal, wherein the first conductive terminal of the fifth transistor is electrically coupled to the second conductive terminal of the fourth transistor, the second conductive terminal of the fifth transistor is electrically coupled to the data input terminal and the output from a NOR gate is applied to the gate terminal of the fifth transistor; and a latching circuit having an input terminal and an output terminal, wherein the input terminal is electrically coupled to the second conductive terminal of the fourth transistor for receiving a first output value and outputting a corresponding second output value within a preset period.

2. A sense amplifier circuit for sensing data fed to a data input terminal thereof and operating on the data according to a pre-charge signal, a latching signal and a sense enable signal, the sense amplifier circuit comprising:

a pre-charge sense circuit that outputs a first output value according to data fed to the data input terminal;

a latching circuit for receiving the first output value and producing a corresponding second output value within a preset period, wherein the pre-charge sense circuit includes a first circuit and a second circuit, wherein the first circuit is for pre-charging the data input terminal to a preset potential level and is further comprised of:

a first transistor having a first conductive terminal, a second conductive terminal and a gate terminal, wherein the first conductive terminal is electrically coupled to the voltage source and the gate terminal is electrically coupled to the pre-charge signal;

a second transistor having a first conductive terminal, a second conductive terminal and a gate terminal, wherein the second conductive terminal of the second transistor is electrically coupled to the data input terminal, with a signal from the data input terminal and the sense enable signal being processed in a NOR logic operation producing an output to apply to the gate terminal of the second transistor, and the first conductive terminal of the second transistor is electrically coupled to the second conductive terminal of the first transistor;

and wherein the second circuit is for outputting the first output value according to input data fed to the data input terminal, and the first circuit and the second circuit are connected in parallel between a source voltage and the data input terminal.

3. A sense amplifier circuit for sensing data fed to a data input terminal thereof and operating on the data according to a pre-charge signal, a latching signal and a sense enable signal, the sense amplifier circuit comprising:

a pre-charge sense circuit that outputs a first output value according to data fed to the data input terminal; and a latching circuit for receiving the first output value and producing a corresponding second output value within a preset period, wherein the pre-charge sense circuit includes a first circuit and a second circuit, the first circuit is for pre-charging the data input terminal to a preset potential level, and wherein the second circuit is for outputting the first output value according to input data fed to the data input terminal and comprised of:

a first transistor having a first conductive terminal, a second conductive terminal and a gate terminal, wherein the first conductive terminal of the first transistor is electrically coupled to the voltage source, and the second conductive terminal of the first transistor and the gate terminal of the first transistor are electrically connected;

a second transistor having a first conductive terminal, a second conductive terminal and a gate terminal, wherein the first conductive terminal of the second transistor and the second conductive terminal of the first transistor are electrically connected and the gate terminal of the second transistor and the pre-charge signal are electrically connected;

a third transistor having a first conductive terminal, a second conductive terminal and a gate terminal, wherein the first conductive terminal of the third transistor and the second conductive terminal of the second transistor are electrically connected, the second conductive terminal of the third transistor and the data input terminal are connected and an output after a NOR logic operation of the data input signal and the sense enable signal is applied to the gate terminal of the third transistor; and the first circuit and the second circuit are connected in parallel between a source voltage and the data input terminal.

4. The sense amplifier circuit of claim 3, wherein the pre-charge sense circuit uses the voltage on the second conductive terminal of the second transistor to serve as the first output value.

* * * * *